United States Patent
Hong (10) Patent No.: US 11,550,355 B2
(45) Date of Patent: Jan. 10, 2023

(54) PHASE CORRECTION CIRCUIT, CLOCK BUFFER AND SEMICONDUCTOR APPARATUS INCLUDING THE SAME

(71) Applicant: SK hynix Inc., Icheon-si (KR)

(72) Inventor: Gi Moon Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/446,196

(22) Filed: Aug. 27, 2021

(65) Prior Publication Data
US 2022/0308617 A1 Sep. 29, 2022

(30) Foreign Application Priority Data

Mar. 25, 2021 (KR) .................. 10-2021-0038622

(51) Int. Cl.
| | | |
|---|---|---|
| G06F 1/04 | (2006.01) | |
| G06F 1/10 | (2006.01) | |
| H03K 19/173 | (2006.01) | |
| H03K 5/05 | (2006.01) | |
| H03K 5/00 | (2006.01) | |

(52) U.S. Cl.
CPC .............. *G06F 1/10* (2013.01); *H03K 5/05* (2013.01); *H03K 19/1737* (2013.01); *H03K 2005/00234* (2013.01); *H03K 2005/00286* (2013.01)

(58) Field of Classification Search
CPC ........ G06F 1/10; H03K 5/05; H03K 19/1737; H03K 2005/00234; H03K 2005/00286
USPC ........................................... 327/291
See application file for complete search history.

(56) References Cited

U.S. PATENT DOCUMENTS

| | | | |
|---|---|---|---|
| 8,050,372 B2 | 11/2011 | Lee | |
| 8,400,196 B2* | 3/2013 | Kim | H03K 5/15013 |
| | | | 327/156 |
| 10,250,243 B2* | 4/2019 | Lee | H03K 5/15033 |
| 10,686,435 B2* | 6/2020 | Seo | G01R 29/0273 |
| 11,005,479 B2* | 5/2021 | Im | H03L 7/0814 |
| 11,092,994 B1* | 8/2021 | Hong | G06F 1/10 |
| 2009/0224811 A1* | 9/2009 | Camara | G06F 1/04 |
| | | | 327/276 |
| 2009/0295441 A1* | 12/2009 | Kwak | H03L 7/0805 |
| | | | 327/158 |
| 2011/0156757 A1* | 6/2011 | Hayashi | G01R 31/31726 |
| | | | 327/161 |
| 2011/0291722 A1* | 12/2011 | Kim | G11C 11/4076 |
| | | | 327/161 |
| 2016/0149563 A1* | 5/2016 | Kim | H03L 7/0814 |
| | | | 327/158 |
| 2016/0182063 A1* | 6/2016 | Seo | H03L 7/16 |
| | | | 327/149 |

* cited by examiner

*Primary Examiner* — Ryan Jager
(74) *Attorney, Agent, or Firm* — Weaver Austin Villeneuve & Sampson LLP (57) ABSTRACT

A phase correction circuit includes: a test clock generation unit including a plurality of signal paths and configurable to generate a plurality of test clock signals in response to a plurality of selection signals and a plurality of phase control signals; a detection unit configured to generate a plurality of detection voltages using the plurality of test clock signals; and a control unit configured to generate the plurality of selection signals, detect phase skews of the plurality of signal paths according to the plurality of detection voltages, and generate the plurality of phase control signals for correcting the phase skews.

19 Claims, 10 Drawing Sheets

PHASE CORRECTION CIRCUIT, CLOCK BUFFER AND SEMICONDUCTOR APPARATUS INCLUDING THE SAME

CROSS-REFERENCES TO RELATED APPLICATION

The present application claims priority under 35 U.S.C. § 119(a) to Korean application number 10-2021-0038622, filed on Mar. 25, 2021, in the Korean Intellectual Property Office, which is herein incorporated by reference in its entirety for all purposes.

BACKGROUND

1. Technical Field

Various embodiments generally relate to a semiconductor circuit, and particularly, to a phase correction circuit, a clock buffer and a semiconductor apparatus including the same.

2. Related Art

A semiconductor circuit, for example, a semiconductor memory device, may use clock signals for read and/or write operations. The clock signals may include multi-phase clock signals, such as a 4-phase clock signal. In some implementations, a clock buffer of the semiconductor memory device may receive clock signals provided by circuits outside of the semiconductor memory device and generate the multi-phase clock signals. Skews may exist in the generated multi-phase clock signals, and/or may be introduced by differences among different signal transmission paths for transmitting the respective multi-phase clock signals. When there are skews in the multi-phase clock signals, the performance of a circuit that processes data using the multi-phase clock signals may be degraded, resulting in deterioration in data reliability or other issues.

SUMMARY

Various embodiments are directed to a phase correction circuit capable of detecting and adjusting the skew of a multi-phase clock signal, a clock buffer and a semiconductor apparatus including the same.

In an embodiment, a phase correction circuit may include: a test clock generation unit including a plurality of signal paths and configurable to generate a plurality of test clock signals in response to a plurality of selection signals and a plurality of phase control signals; a detection unit configured to generate a plurality of detection voltages based on the plurality of test clock signals; and a control unit configured to generate the plurality of selection signals, detect phase skews of the plurality of signal paths according to the plurality of detection voltages, and generate the plurality of phase control signals for correcting the phase skews.

In an embodiment, a clock buffer may include: a phase separator configured to receive external clock signals to generate multi-phase clock signals; a plurality of signal paths configured to delay the multi-phase clock signals and output the delayed multi-phase clock signals as phase correction clock signals; and a phase correction circuit configurable to block input of the multi-phase clock signals to the plurality of signal paths, generate a plurality of test clock signals, and detect and correct skews of the plurality of signal paths by allowing the plurality of test clock signals to pass through the plurality of signal paths.

In an embodiment, a semiconductor apparatus may include: a memory area; a data output circuit configured to receive data from the memory area and output the data according to phase correction clock signals; a plurality of signal paths configured to delay multi-phase clock signals and output the delayed multi-phase clock signals as the phase correction clock signals; and a clock buffer configurable to receive external clock signals to generate the multi-phase clock signals, block input of the multi-phase clock signals to the plurality of signal paths, generate a plurality of test clock signals, and detect and correct skews of the plurality of signal paths by allowing the plurality of test clock signals to pass through the plurality of signal paths.

DETAILED DESCRIPTION

Hereinafter, certain embodiments will be described in more detail with reference to the accompanying drawings.

Figure 1:
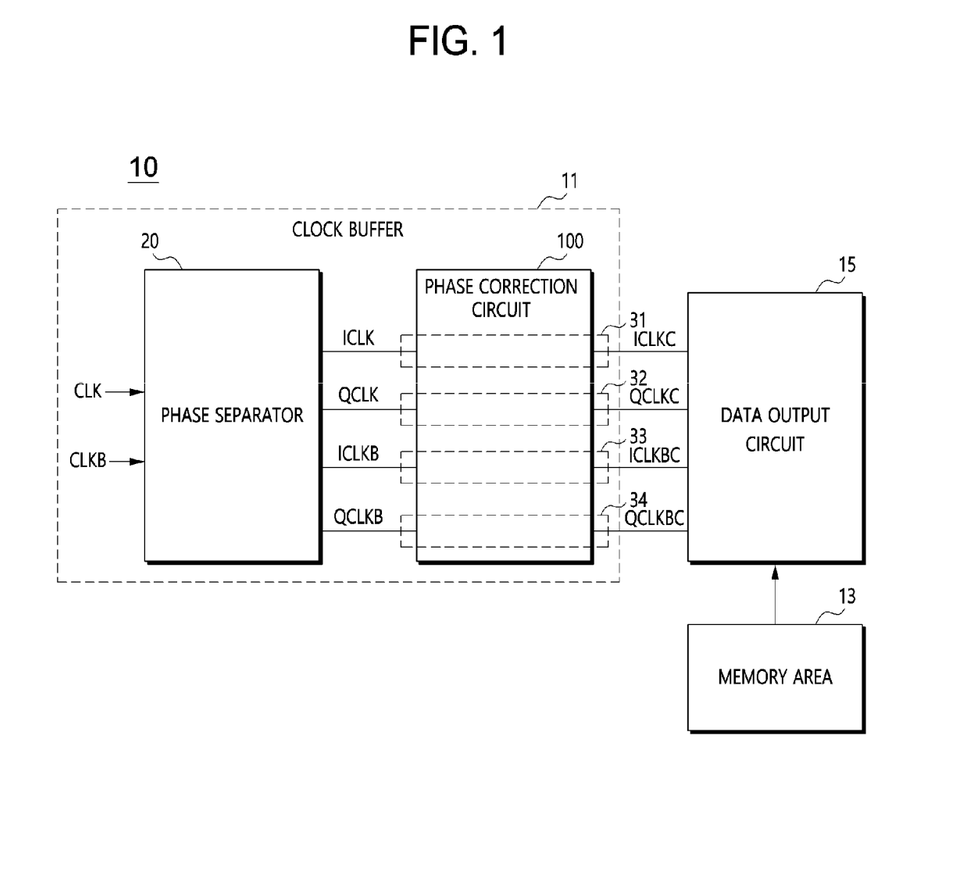
FIG. 1 is a block diagram illustrating an example of a semiconductor apparatus in accordance with an embodiment.

FIG. 1 is a block diagram illustrating an example of a semiconductor apparatus 10 in accordance with an embodiment.

Referring to FIG. 1, the semiconductor apparatus 10 in accordance with an embodiment may include a clock buffer 11, a memory area 13, and a data output circuit 15.

In the illustrated example, the clock buffer 11 may receive external clock signals CLK and CLKB to generate multi-phase clock signals ICLK, ICLKB, QCLK, and QCLKB. The clock buffer 11 may output signals that have passed through a plurality of signal paths 31 to 34 as phase correction clock signals ICLKC, ICLKBC, QCLKC, and QCLKBC. In a test mode, the clock buffer 11 may generate a plurality of test clock signals, without using the external clock signals CLK and CLKB, for example, in a configuration in which a host, such as a memory controller that provides the external clock signals CLK and CLKB, is not connected. The clock buffer 11 may detect and correct skews of the plurality of signal paths 31 to 34 by allowing the plurality of test clock signals to pass through the plurality of signal paths 31 to 34 through which the multi-phase clock signals ICLK, ICLKB, QCLK, and QCLKB may pass. In the test mode, the clock buffer 11 may block the input of the multi-phase clock signals ICLK, ICLKB, QCLK, and QCLKB to the plurality of signal paths 31 to 34, and may generate the plurality of test clock signals. In a normal mode, the clock buffer 11 may not generate the plurality of test clock signals, and may instead output the phase correction clock signals ICLKC, ICLKBC, QCLKC, and QCLKBC, which may be generated by allowing the multi-phase clock signals ICLK, ICLKB, QCLK, and QCLKB to pass through the plurality of signal paths 31 to 34, to the outside of the clock buffer 11.

In the example illustrated in FIG. 1, the clock buffer 11 may include a phase separator 20, the plurality of signal paths 31 to 34, and a phase correction circuit 100. The plurality of signal paths 31 to 34, and the phase correction circuit 100 may share some common circuits.

The phase separator 20 may receive the external clock signals CLK and CLKB to generate the multi-phase clock signals ICLK, ICLKB, QCLK, and QCLKB. The phase separator 20 may separate and simultaneously divide the phases of the external clock signals CLK and CLKB so that the multi-phase clock signals ICLK, ICLKB, QCLK, and QCLKB have lower frequencies (e.g., divided frequencies), such as about ½ or ¼, compared to those of the external clock signals CLK and CLKB.

The plurality of signal paths 31 to 34 may transmit the multi-phase clock signals ICLK, ICLKB, QCLK, and QCLKB to the data output circuit 15. The plurality of signal paths 31 to 34 may delay the multi-phase clock signals ICLK, ICLKB, QCLK, and QCLKB and transmit the delayed signals to the data output circuit 15 as the phase correction clock signals ICLKC, ICLKBC, QCLKC, and QCLKBC.

The phase correction circuit 100 may (e.g., in a test mode) generate the plurality of test clock signals without the input of the multi-phase clock signals ICLK, ICLKB, QCLK, and QCLKB. The phase correction circuit 100 may detect and correct the skews of the plurality of signal paths 31 to 34, through which the multi-phase clock signals ICLK, ICLKB, QCLK, and QCLKB may pass, by using the plurality of test clock signals generated by the phase correction circuit 100. In the test mode, the phase correction circuit 100 may block the input of the multi-phase clock signals ICLK, ICLKB, QCLK, and QCLKB to the plurality of signal paths 31 to 34, and may generate the plurality of test clock signals for phase correction. In the normal mode, the phase correction circuit 100 may not generate the plurality of test clock signals, and may instead output the phase correction clock signals ICLKC, ICLKBC, QCLKC, and QCLKBC, which may be generated by allowing the multi-phase clock signals ICLK, ICLKB, QCLK, and QCLKB to pass through the plurality of signal paths 31 to 34, to the outside of the clock buffer 11.

The memory area 13 may include at least one of a volatile memory or a nonvolatile memory. Examples of the volatile memory may include a static RAM (SRAM), a dynamic RAM (DRAM), a synchronous DRAM (SDRAM), and the like. Examples of the nonvolatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and the like. The memory area 13 may output stored data during a read operation of the semiconductor apparatus 10, and may store data from the outside of the semiconductor apparatus 10 during a write operation.

The data output circuit 15 may send data outputted from the memory area 13, to the outside of the semiconductor apparatus 10, according to the phase correction clock signals ICLKC, ICLKBC, QCLKC, and QCLKBC.

Figure 2:
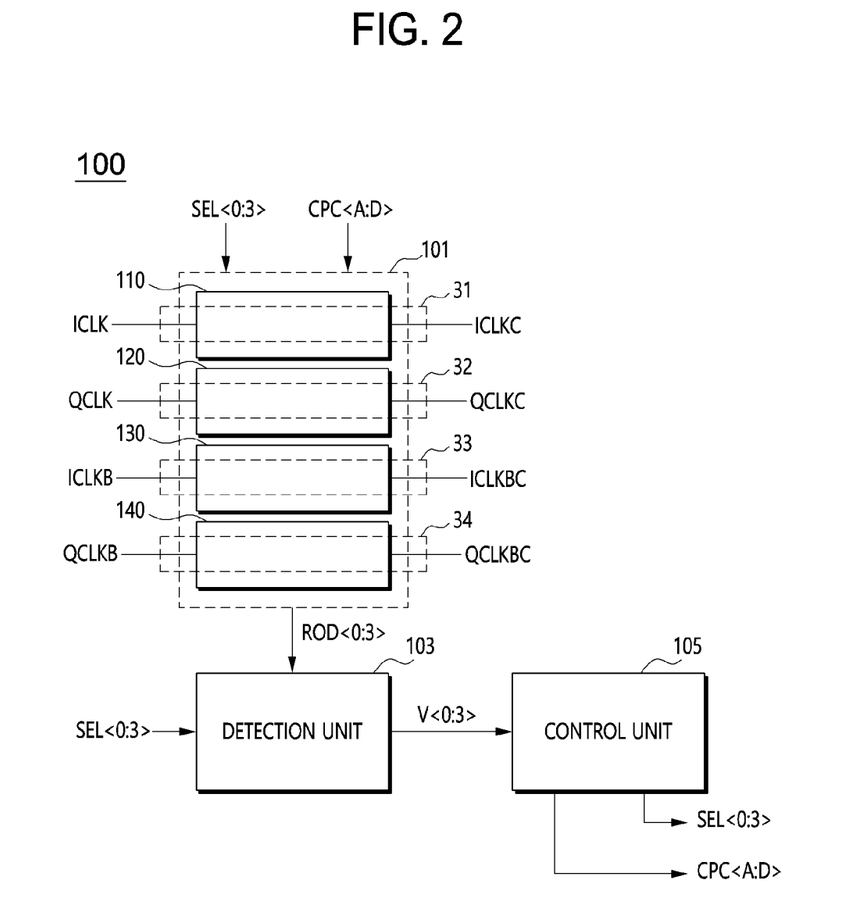
FIG. 2 is a block diagram of an example of a phase correction circuit in the example of the semiconductor apparatus of FIG. 1.

FIG. 2 is a block diagram of an example of the phase correction circuit 100 in the example of the semiconductor apparatus of FIG. 1.

In the example illustrated in FIG. 2, the phase correction circuit 100 may include a test clock generation unit 101, a detection unit 103, and a control unit 105.

The test clock generation unit 101 may generate a plurality of test clock signals ROD<0:3> in response to a plurality of selection signals SEL<0:3> and a plurality of phase control signals CPC<A:D>. Each of the plurality of phase control signals CPC<A:D> may include at least one signal bit. The test clock generation unit 101 may block the input of external signals, such as the multi-phase clock signals ICLK, ICLKB, QCLK, and QCLKB, to the plurality of signal paths 31 to 34, in response to the plurality of selection signals SEL<0:3>, and may generate the plurality of test clock signals ROD<0:3>. The test clock generation unit 101 may stop generating the plurality of test clock signals ROD<0:3> in response to the plurality of selection signals SEL<0:3>, and may generate the phase correction clock signals ICLKC, ICLKBC, QCLKC, and QCLKBC by allowing the multi-phase clock signals ICLK, ICLKB, QCLK, and QCLKB to pass through the plurality of signal paths 31 to 34. The test clock generation unit 101 may correct the skews of the multi-phase clock signals ICLK, ICLKB, QCLK, and QCLKB due to, for example, differences in the plurality of signal paths 31 to 34, by adjusting delay times among the plurality of signal paths 31 to 34 in response to the plurality of phase control signals CPC<A:D>. The test clock generation unit 101 may include first to fourth test clock generation units 110, 120, 130, and 140. The number of test clock generation units included in the test clock generation unit 101 may depend on the number of input signals, such as the number of the multi-phase clock signals ICLK, ICLKB, QCLK, and QCLKB, and thus may vary depending on the number of the multi-phase clock signals. The first to fourth test clock generation units 110, 120, 130, and 140 may have substantially the same configuration.

The first test clock generation unit 110 may block the input of a first phase clock signal (e.g., phase clock signal ICLK) among the multi-phase clock signals ICLK, ICLKB, QCLK, and QCLKB in response to a first selection signal SEL<0> (e.g., having a high level), and may generate a first test clock signal (e.g., test clock signal ROD<0>). The first test clock generation unit 110 may stop generating the first test clock signal in response to the first selection signal SEL<0> (e.g., having a low level), and may generate a first phase correction clock signal (e.g., the phase correction clock signal ICLKC) by allowing the first phase clock signal to pass through a first signal path 31. The first test clock generation unit 110 may correct the skew of the first phase clock signal by adjusting the delay time in the first signal path 31 in response to a first phase control signal (e.g., phase control signal CPC<A>).

The second test clock generation unit 120 may block the input of a second phase clock signal (e.g., phase clock signal QCLK) among the multi-phase clock signals ICLK, ICLKB, QCLK, and QCLKB in response to a second selection signal SEL<1> (e.g., having a high level), and may generate a second test clock signal (e.g., test clock signal ROD<1>).

The second test clock generation unit 120 may stop generating the second test clock signal in response to the second selection signal SEL<1> (e.g., having a low level), and may generate a second phase correction clock signal (e.g., phase correction clock signal QCLKC) by allowing the second phase clock signal to pass through a second signal path 32. The second test clock generation unit 120 may correct the skew of the second phase clock signal by adjusting the delay time in the second signal path 32 in response to a second phase control signal (e.g., phase control signal CPC<B>).

The third test clock generation unit 130 may block the input of a third phase clock signal (e.g., phase clock signal ICLKB) among the multi-phase clock signals ICLK, ICLKB, QCLK, and QCLKB in response to a third selection signal SEL<2> (e.g., at a high level), and may generate a third test clock signal (e.g., test clock signal ROD<2>). The third test clock generation unit 130 may stop generating the third test clock signal in response to the third selection signal SEL<2> (e.g., at a low level), and may generate a third phase correction clock signal (e.g., phase correction clock signal ICLKBC) by allowing the third phase clock signal to pass through a third signal path 33. The third test clock generation unit 130 may correct the skew of the third phase clock signal by adjusting the delay time in the third signal path 33 in response to a third phase control signal (e.g., phase control signal CPC<C>).

The fourth test clock generation unit 140 may block the input of a fourth phase clock signal (e.g., phase clock signal QCLKB) among the multi-phase clock signals ICLK, ICLKB, QCLK, and QCLKB in response to a fourth selection signal SEL<3> (e.g., at a high level), and may generate a fourth test clock signal (e.g., test clock signal ROD<3>). The fourth test clock generation unit 140 may stop generating the fourth test clock signal in response to the fourth selection signal SEL<3> (e.g., at a low level), and may generate a fourth phase correction clock signal (e.g., phase correction clock signal QCLKBC) by allowing the fourth phase clock signal to pass through a fourth signal path 34. The fourth test clock generation unit 140 may correct the skew of the fourth phase clock signal by adjusting the delay time in the fourth signal path 34 in response to a fourth phase control signal (e.g., phase control signal CPC<D>).

The detection unit 103 may generate a plurality of detection voltages V<0:3> in response to the plurality of selection signals SEL<0:3> and the plurality of test clock signals ROD<0:3>.

The control unit 105 may generate the plurality of selection signals SEL<0:3> to match the operation of the phase correction circuit 100, detect phase skews of the plurality of signal paths 31 to 34 according to the plurality of detection voltages V<0:3>, and generate the plurality of phase control signals CPC<A:D> for correcting the phase skews.

Figure 3:
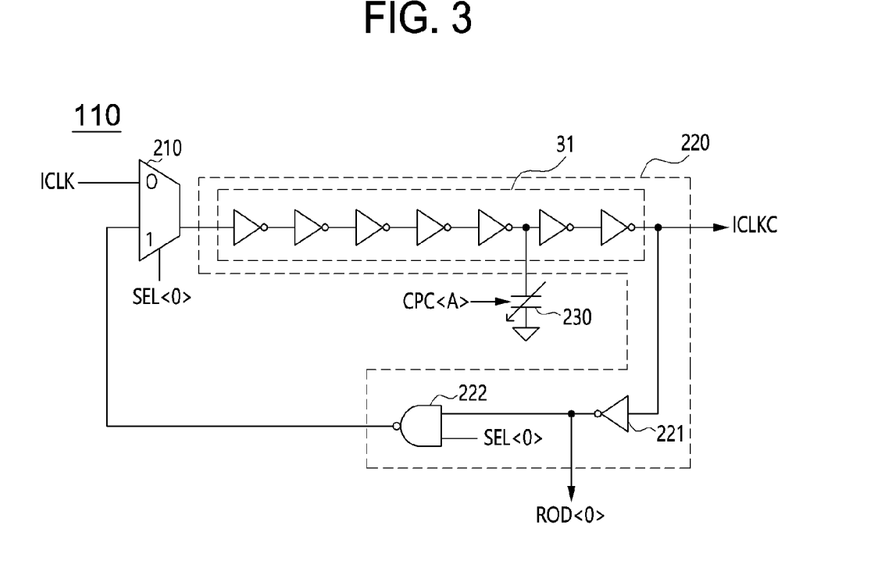
FIG. 3 is a schematic of an example of a first test clock generation unit of the phase correction circuit of FIG. 2.

FIG. 3 is a schematic of an example of the first test clock generation unit 110 in the example of the phase correction circuit 100 of FIG. 2.

Referring to FIG. 3, the first test clock generation unit 110 may include a multiplexer 210, an oscillation circuit 220, and a delay adjustment circuit 230.

The multiplexer 210 may output one of the first phase clock signal ICLK and the first test clock signal ROD<0> (or an inverse of the first test clock signal ROD<0>) in response to the first selection signal SEL<0>.

The oscillation circuit 220 may generate the first test clock signal ROD<0> in response to the first selection signal SEL<0>. The oscillation circuit 220 may be a ring oscillator and may generate the first test clock signal ROD<0> when the first selection signal SEL<0> is at a high level, and may fix the first test clock signal ROD<0> to a predetermined level, for example, a high level or a low level, when the first selection signal SEL<0> is at a low level. The oscillation circuit 220 may include at least a portion of the first signal path 31, an inverter 221, and a NAND gate 222. The first signal path 31 may include an inverter array. The inverter 221 may invert the output of the first signal path 31. The output of the inverter 221 may be outputted as the first test clock signal ROD<0>. The NAND gate 222 may perform a NAND operation on the output of the inverter 221 and the first selection signal SEL<0>, and output the NAND operation result to an input port of the multiplexer 210.

The delay adjustment circuit 230 may adjust the delay time in the first signal path 31 in response to the first phase control signal CPC<A>. The delay adjustment circuit 230 may include a capacitor 230 with variable capacitance. The capacitor 230 may have one end connected to a ground terminal. As the capacitance of the capacitor 230 varies according to the first phase control signal CPC<A>, the 1o capacitor 230 may change the delay time in the first signal path 31, and thus the frequency of the first test clock signal ROD<0>. In some embodiments, the range of the capacitance adjustment of capacitor 230 may increase in proportion to the number of bits of the first phase control signal CPC<A>.

Figure 4:
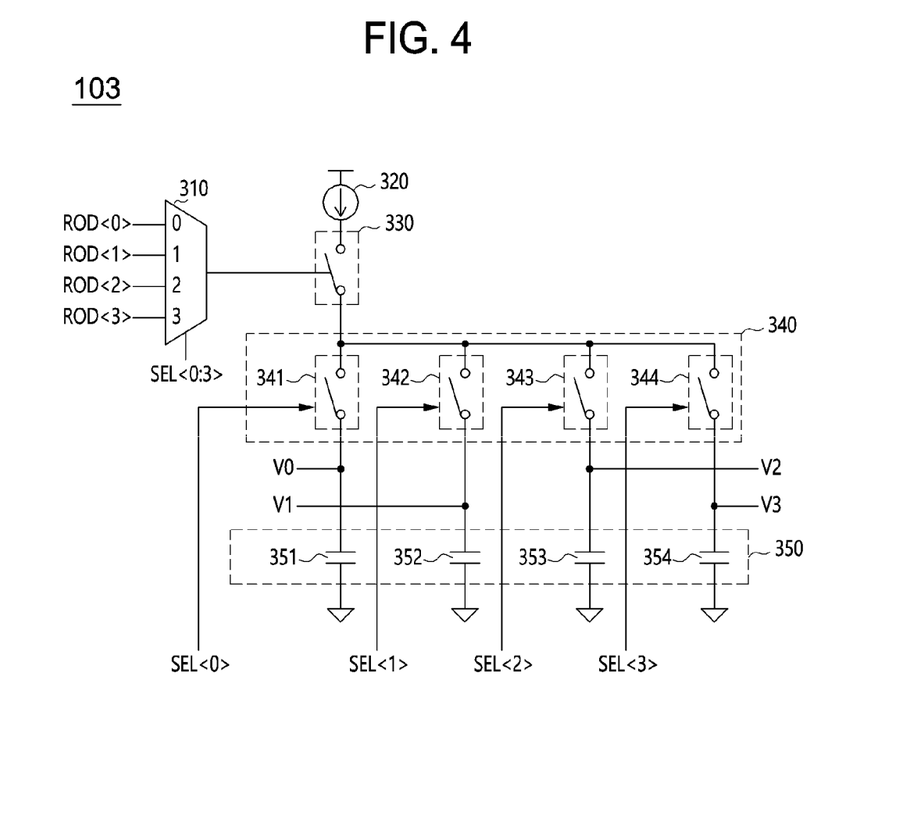
FIG. 4 is a schematic of an example of a detection unit of the phase correction circuit of FIG. 2.

FIG. 4 is a schematic of an example of the detection unit 103 of the phase correction circuit 100 of FIG. 2.

In the example illustrated in FIG. 4, the detection unit 103 may include a multiplexer 310, a current source 320, a first switching section 330, a second switching section 340, and a capacitor array 350.

The multiplexer 310 may select and output one test clock signal of the plurality of test clock signals ROD<0:3> according to the plurality of selection signals SEL<0:3>. For example, the multiplexer 310 may output the first test clock signal ROD<0> when the first selection signal SEL<0> is at a high level, output the second test clock signal ROD<1> when the second selection signal SEL<1> is at a high level, output the third test clock signal ROD<2> when the third selection signal SEL<2> is at a high level, and output the fourth test clock signal ROD<3> when the fourth selection signal SEL<3> is at a high level.

The first switching section 330 may have a first end connected to current source 320. In one example, the first switching section 330 may be turned on when the output of the multiplexer 310 is at a high level, and may be turned off when the output of the multiplexer 310 is at a low level.

The second switching section 340 may include switches 341 to 344 each having one end connected to a second end of the first switching section 330. The switches 341 to 344 may be turned on/off according to the plurality of selection signals SEL<0:3>, respectively.

The capacitor array 350 may include capacitors 351 to 354 connected to the switches 341 to 344 of the second switching section 340, respectively. The capacitors 351 to 354 may be charged by a current from current source 320 to generate voltage signals across the capacitors 351 to 354. The charge time and thus the levels of the voltages across the capacitors 351 to 354 may be controlled by test clock signals ROD<0:3> and the selection signals SEL<0:3>. Voltages stored in the capacitors 351 to 354 may be outputted as the plurality of detection voltages V<0:3>.

Figure 5:
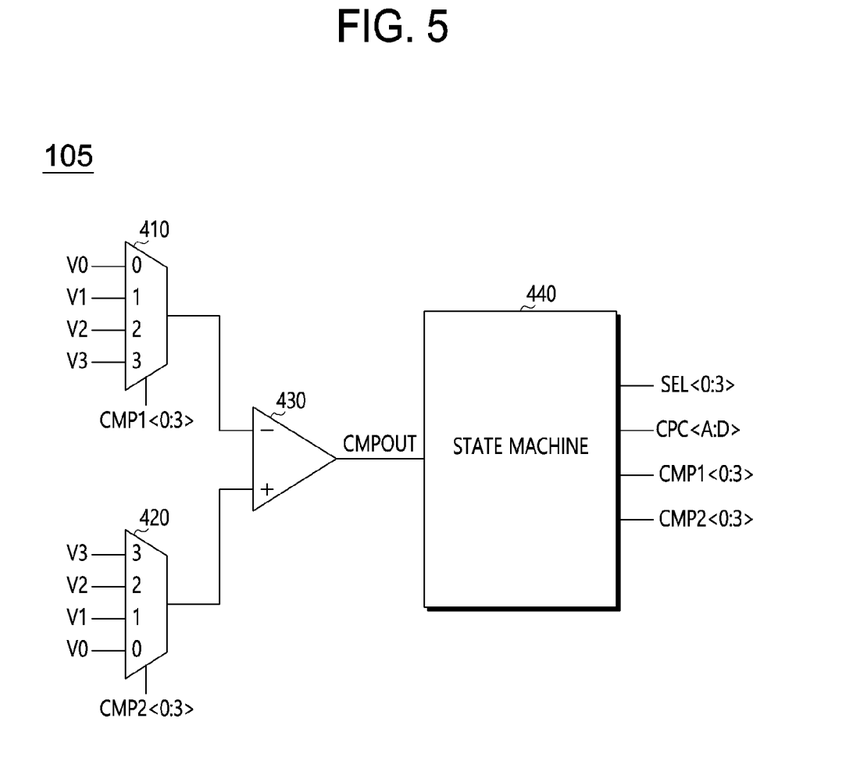
FIG. 5 is a block diagram of an example of a control unit of the phase correction circuit of FIG. 2.

FIG. 5 is a block diagram of an example of the control unit 105 of the phase correction circuit 100 of FIG. 2.

In the example illustrated in FIG. 5, the control unit 105 may include a first multiplexer 410, a second multiplexer 420, a comparator 430, and a state machine 440.

The first multiplexer 410 may select and output one detection voltage of the plurality of detection voltages V<0:3> according to a plurality of first comparison control signals CMP1<0:3>.

The second multiplexer 420 may select and output another detection voltage of the plurality of detection voltages V<0:3> according to a plurality of second comparison control signals CMP2<0:3>.

The comparator 430 may generate a comparison result signal CMPOUT by comparing the output of the first multiplexer 410 and the output of the second multiplexer 420.

The state machine 440 may generate the plurality of selection signals SEL<0:3>, the plurality of first comparison control signals CMP1<0:3>, the plurality of second comparison control signals CMP2<0:3>, and the plurality of phase control signals CPC<A:D> to control the phase correction operation of the phase correction circuit 100 using programs designed for operations of the semiconductor apparatus 10. For example, the state machine 440 may generate the plurality of selection signals SEL<0:3> to sample the plurality of detection voltages V<0:3>. The state machine 440 may generate the plurality of first comparison control signals CMP1<0:3> and the plurality of second comparison control signals CMP2<0:3> so that detection voltages V<0:3> of the plurality of detection voltages V<0:3> may be compared with one another and the comparison result signal CMPOUT may be generated according to the comparison result. The state machine 440 may detect a maximum value and a minimum value among the plurality of detection voltages V<0:3> according to the comparison result signal CMPOUT. The state machine 440 may generate the plurality of phase control signals CPC<A:D> based on the minimum value to adjust the delay times of the plurality of signal paths 31 to 34, thereby allowing differences in the delay times among the plurality of signal paths 31 to 34 to be reduced or eliminated. The state machine 440 may determine whether to end the phase correction operation of the phase correction circuit 100 according to whether the maximum value is changed.

Figure 6:
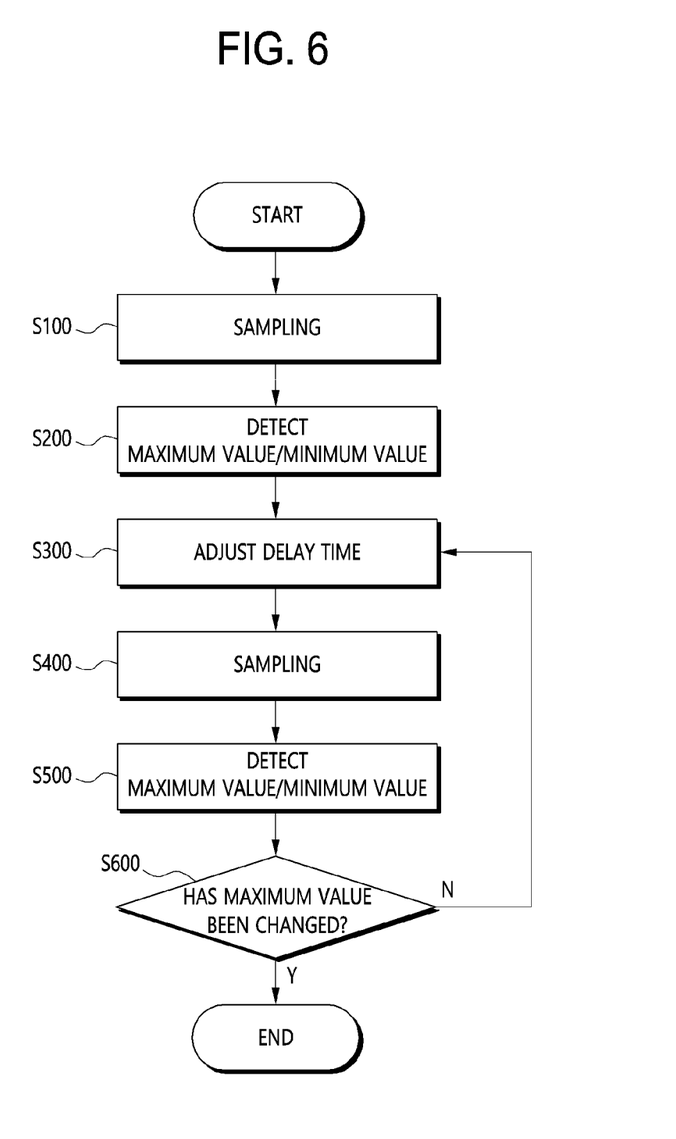
FIG. 6 is a flowchart illustrating an example of a phase correction method in accordance with an embodiment.

FIG. 6 is a flowchart illustrating an example of a phase correction method in accordance with an embodiment.

The phase correction operation in accordance with an embodiment may be performed in a state in which the external clock signals CLK and CLKB are not inputted, or may be performed by forcibly blocking the input of the multi-phase clock signals ICLK, ICLKB, QCLK, and QCLKB to the plurality of signal paths 31 to 34.

In the example illustrated in FIG. 6, first, a sampling step S100 may be performed. The sampling step S100 may include an operation of generating voltages corresponding to the high level duration of each of the plurality of test clock signals ROD<0:3> passing through the plurality of signal paths 31 to 34, that is, the plurality of detection voltages V<0:3>. An example of the operation of the sampling step S100 is described in detail below with reference to FIG. 7 and FIG. 8.

After the sampling step S100, a maximum value/minimum value detection step S200 may be performed to detect a maximum value and a minimum value among the plurality of detection voltages V<0:3>. An example of the operation of the maximum value/minimum value detection step S200 is described in detail below with reference to FIG. 9A and FIG. 9B.

After the maximum value/minimum value detection step S200, a delay time adjustment step S300 may be performed. The delay time adjustment step S300 may include adjusting the delay time of a signal path corresponding to the minimum value among the plurality of signal paths 31 to 34, thereby correcting the phase delay of a signal transmitted through the corresponding signal path.

After the delay time adjustment step S300, a sampling step S400 and a maximum value/minimum value detection step S500 may be performed. The sampling step S400 may be performed in substantially the same manner as the sampling step S100. The maximum value/minimum value detection step S500 may be performed in substantially the same manner as the maximum value/minimum value detection step S200.

After the maximum value/minimum value detection step S500, it is determined whether the maximum value has been changed (in step S600). When the determination result of step S600 indicates that the maximum value has been changed, the phase correction operation may be ended. Since the fact that the determination result of step S600 indicates that the maximum value has been changed means that the differences in the delay times among the plurality of signal paths 31 to 34 have been reduced to within a preset error range, the phase correction operation may be ended. On the other hand, when the determination result of step S600 indicates that the maximum value has not been changed, the steps S300, S400, S500, and S600 may be performed again.

Figure 7:
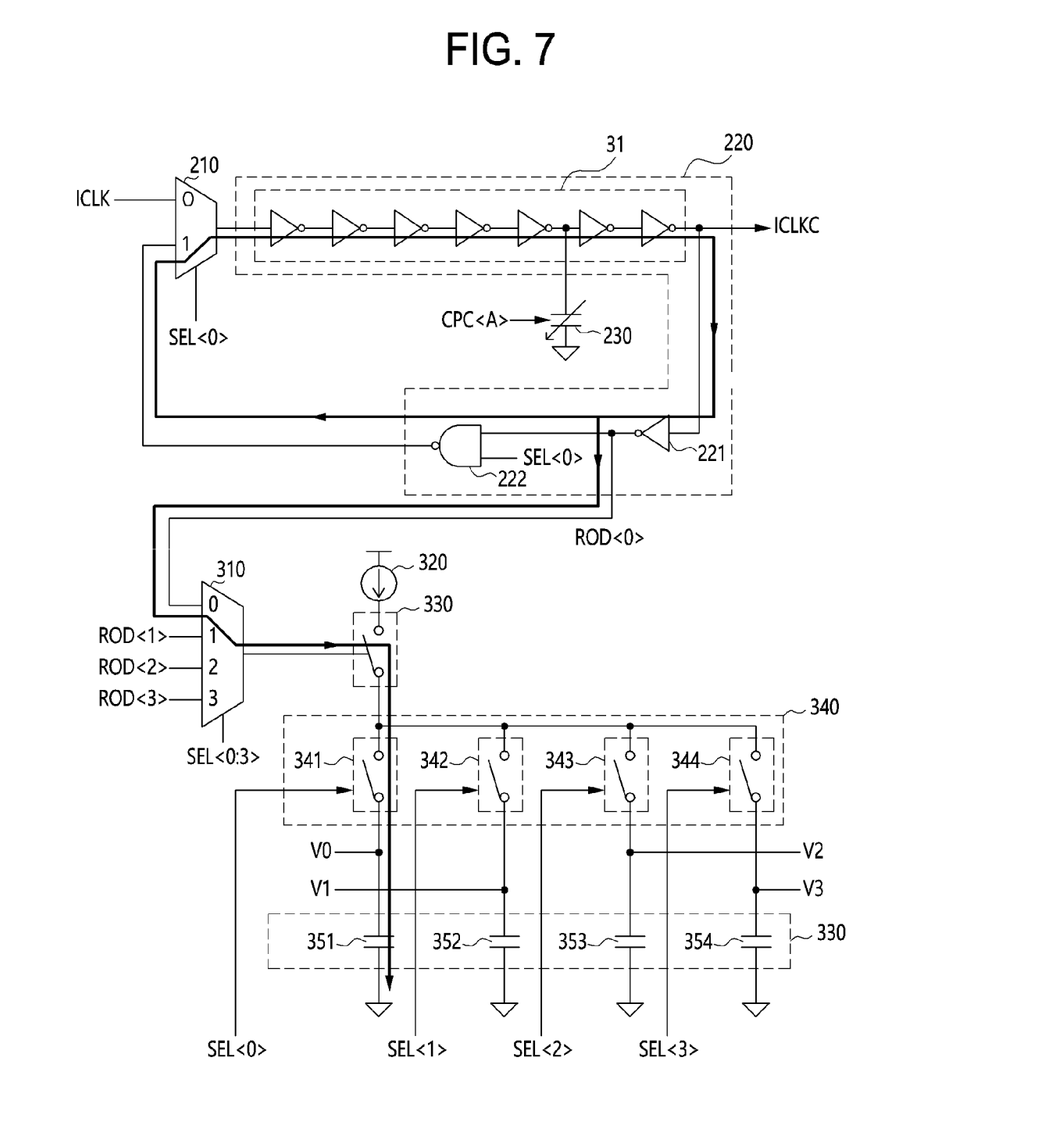
FIG. 7 includes a schematic illustrating an example of a sampling step of the phase correction method of FIG. 6.
Figure 8:
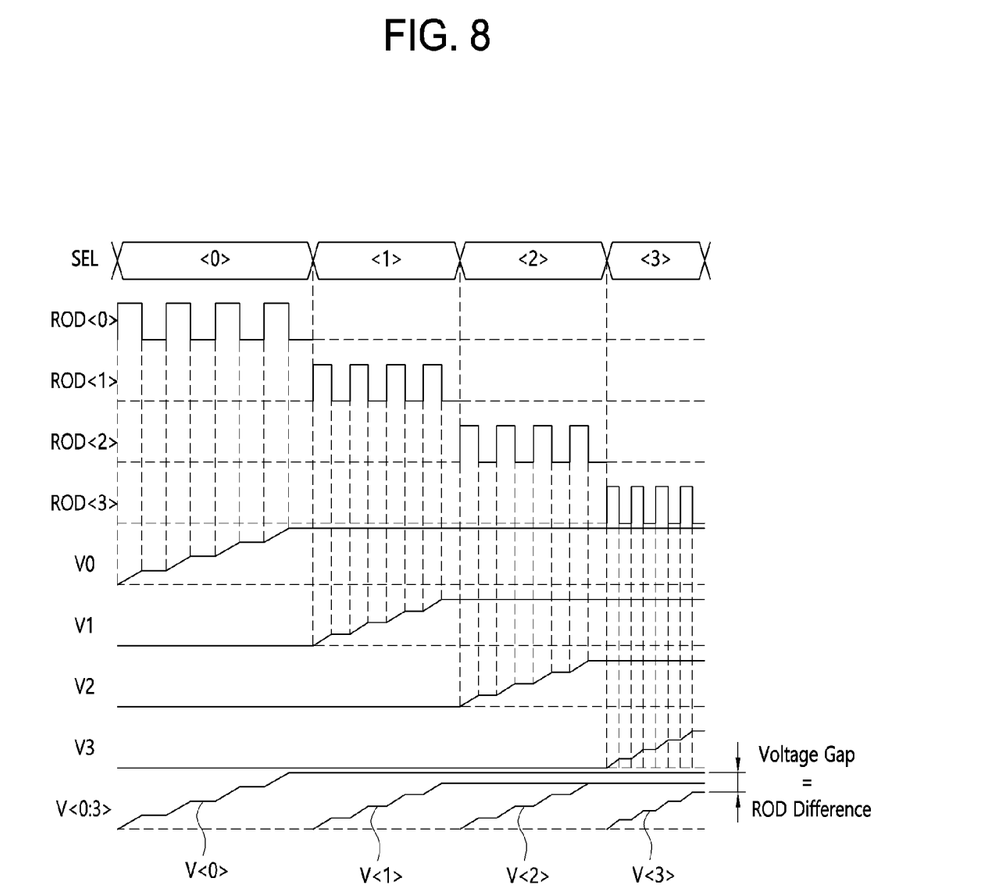
FIG. 8 illustrates examples of signal waveforms in the sampling step of the phase correction method of FIG. 6.

FIG. 7 and FIG. 8 illustrate an example of the sampling step S100 of FIG. 6. FIG. 7 illustrates an example of the sampling process for generating a first detection voltage V<0> by the first test clock generation unit 110 and the detection unit 103. FIG. 8 illustrates waveforms of the plurality of selection signals SEL<0:3>, the plurality of test clock signals ROD<0:3>, and the plurality of detection voltages V<0:3> during the sampling step S100.

Referring to FIG. 8, the state machine 440 of FIG. 5 may sequentially set the selection signals of the plurality of selection signals SEL<0:3> to a high level for respective predetermined durations.

Referring to FIG. 7, when only the first selection signal SEL<0> among the plurality of selection signals SEL<0:3> is at a high level, the input of the first phase clock signal ICLK to the first signal path 31 is blocked, and the oscillation circuit 220 may operate to generate the first test clock signal ROD<0>. Since only the first selection signal SEL<0> is at a high level, only the switch 341 among the switches 341 to 344 of the second switching section 340 may be turned on, and the multiplexer 310 may output the first test clock signal ROD<0> to turn on the first switching section 330 during the high level durations of the first test clock signal ROD<0>. Therefore, the capacitor 351 may be charged by the current source 320 during the turn-on durations of the first switching section 330, and the voltage across the capacitor 351 generated by the charging may be the first detection voltage V<0>. By sequentially setting the selection signals of the plurality of selection signals SEL<0:3> to a high level for respective predetermined durations in the aforementioned manner, a second detection voltage V<1>, a third detection voltage V<2>, and a fourth detection voltage V<3> may be generated in the sampling step S100 of FIG. 6.

FIG. 8 illustrates an example in which each test clock signals of the plurality of test clock signals ROD<0:3> has four clock pulses. However, the present disclosure is not limited thereto. In different embodiments, the number of pulses in each test clock signal of the plurality of test clock signals ROD<0:3> may vary, depending on, for example, the circuit design of the current source 320, the capacity of the capacitor 230, and the like. FIG. 8 shows that, due to the different high-level durations of the test clock signals ROD<0:3> and thus the different charging times of the capacitors 351 to 354, the detection voltages V<0:3> may be different. A voltage gap between a maximum value of the detection voltages V<0:3> and a minimum value of the detection voltages V<0:3> may indicate a difference between test clock signals ROD<0:3> and a difference between the propagation delays of signal paths 31 to 34.

Figure 9A:
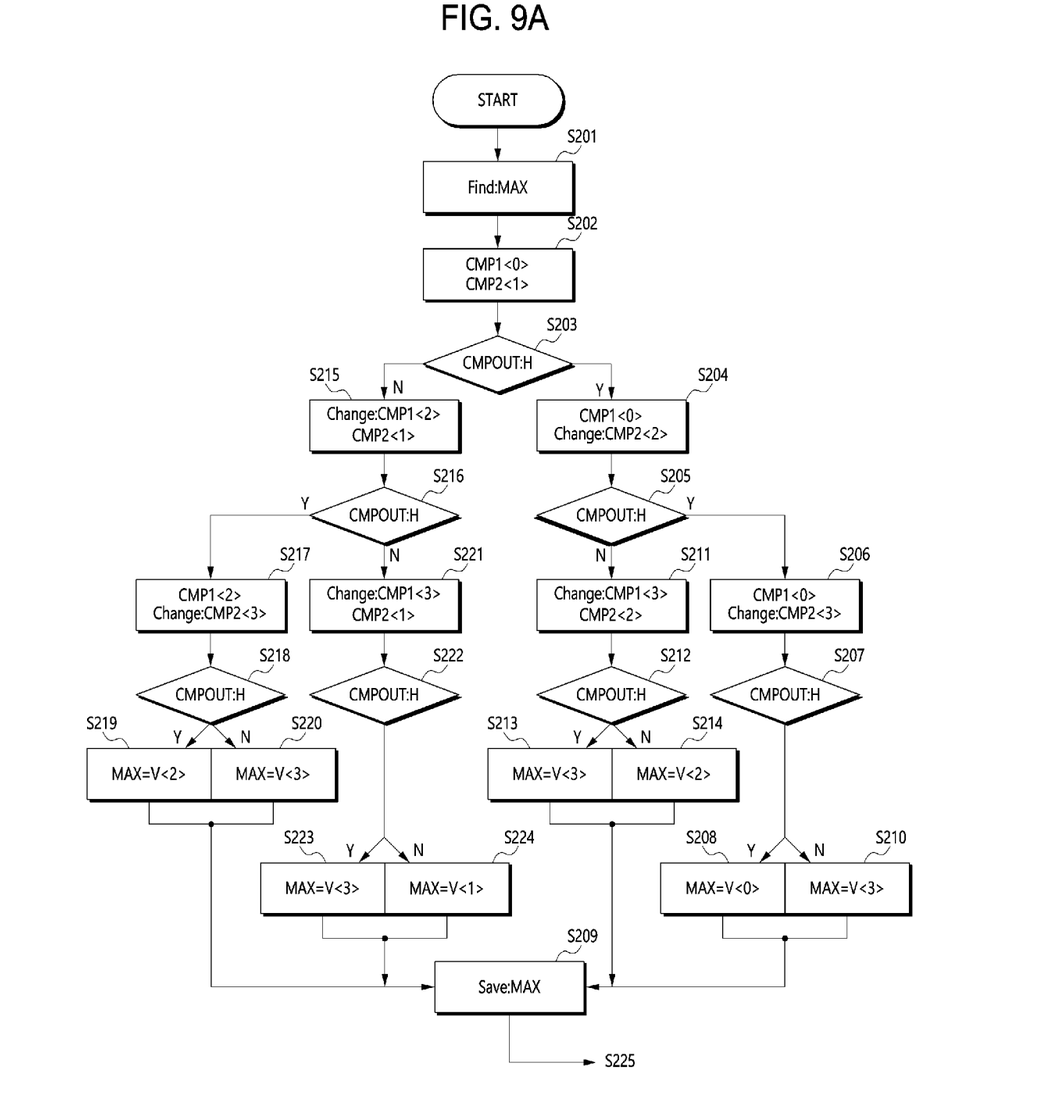
FIG. 9A includes a flowchart illustrating an example of a maximum value detection step of the phase correction method of FIG. 6.
Figure 9B:
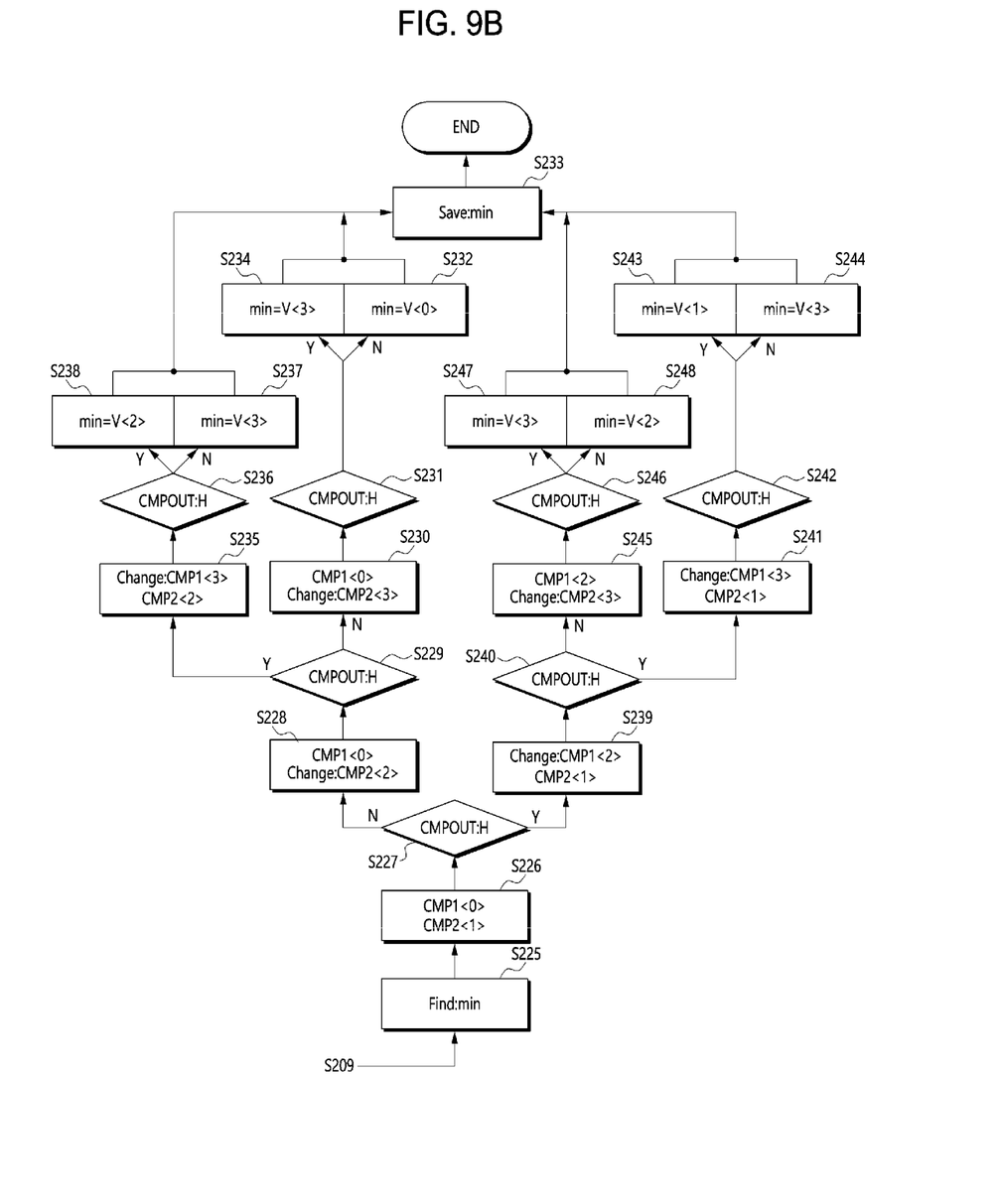
FIG. 9B includes a flowchart illustrating an example of a minimum value detection step of the phase correction method of FIG. 6.

FIG. 9A and FIG. 9B include flowcharts illustrating an example of the maximum value/minimum value detection step S200 of FIG. 6.

Examples of the operations of the control unit 105 for detecting the maximum value among the plurality of detection voltages V<0:3> are described below with reference to FIG. 9A.

In the illustrated example, the control unit 105 may start a maximum value detection in step S201. For example, the control unit 105 may first set a first comparison control signal CMP1<0> and a second comparison control signal CMP2<1> to a high level. Since the first comparison control signal CMP1<0> and the second comparison control signal CMP2<1> are at a high level, the first multiplexer 410 may select the first detection voltage V<0> and output the first detection voltage V<0> to the comparator 430, and the second multiplexer 420 may select the second detection voltage V<1> and output the second detection voltage V<1> to the comparator 430. The comparator 430 may generate the comparison result signal CMPOUT by comparing the levels of the first detection voltage V<0> and the second detection voltage V<1> in step S202. The operations of the first multiplexer 410, the second multiplexer 420, and the comparator 430 according to the plurality of first comparison control signals CMP1<0:3> and the plurality of second comparison control signals CMP2<0:3> may be similar to the operations described above with respect to, for example, FIG. 5.

In step S203, the control unit 105 may determine whether the comparison result signal CMPOUT generated in step S202 is at a high level. When the determination result in step S203 indicates that the comparison result signal CMPOUT generated in step S202 is at a high level, that is, when the level of the first detection voltage V<0> is higher than that of the second detection voltage V<1>, the control unit 105 may, in step S204, set the second comparison control signal CMP2<2> to a high level, compare the levels of the first detection voltage V<0> and the third detection voltage V<2>, and generate the comparison result signal CMPOUT.

In step S205, the control unit 105 may determine whether the comparison result signal CMPOUT generated in step S204 is at a high level. When the determination result in step S205 indicates that the comparison result signal CMPOUT generated in step S204 is at a high level, that is, when the level of the first detection voltage V<0> is higher than that of the third detection voltage V<2>, the control unit 105 may, in step S206, set the second comparison control signal CMP2<3> to a high level, compare the levels of the first detection voltage V<0> and the fourth detection voltage V<3>, and generate the comparison result signal CMPOUT.

In step S207, the control unit 105 may determine whether the comparison result signal CMPOUT generated in step S206 is at a high level. When the determination result in step S207 indicates that the comparison result signal CMPOUT generated in step S206 is at a high level, that is, when the level of the first detection voltage V<0> is higher than that of the fourth detection voltage V<3>, the control unit 105 may determine and save the first detection voltage V<0> as the maximum value in step S208 and step S209.

When the determination result in step S207 indicates that the comparison result signal CMPOUT generated in step S206 is at a low level, that is, when the level of the first detection voltage V<0> is lower than that of the fourth detection voltage V<3>, the control unit 105 may determine and save the fourth detection voltage V<3> as the maximum value in step S210 and step S209.

When the determination result in step S205 indicates that the comparison result signal CMPOUT generated in step S204 is at a low level, that is, when the level of the first detection voltage V<0> is lower than that of the third detection voltage V<2>, the control unit 105 may set the first comparison control signal CMP1<3> to a high level, compare the levels of the fourth detection voltage V<3> and the third detection voltage V<2>, and generate the comparison result signal CMPOUT in step S211.

In step S212, the control unit 105 may determine whether the comparison result signal CMPOUT generated in step S211 is at a high level. When the determination result in step S212 indicates that the comparison result signal CMPOUT generated in step S211 is at a high level, that is, when the level of the fourth detection voltage V<3> is higher than that of the third detection voltage V<2>, the control unit 105 may determine and save the fourth detection voltage V<3> as the maximum value in step S213 and step S209.

When the determination result in step S212 indicates that the comparison result signal CMPOUT generated in step S211 is at a low level, that is, when the level of the fourth detection voltage V<3> is lower than that of the third detection voltage V<2>, the control unit 105 may determine and save the third detection voltage V<2> as the maximum value in step S214 and step S209.

When the determination result in step S203 indicates that the comparison result signal CMPOUT generated in step 202 is at a low level, that is, when the level of the first detection voltage V<0> is lower than that of the second detection voltage V<1>, the control unit 105 may set the first comparison control signal CMP1<2> to a high level, compare the levels of the third detection voltage V<2> and the second detection voltage V<1>, and generate the comparison result signal CMPOUT in step S215.

In step S216, the control unit 105 may determine whether the comparison result signal CMPOUT generated in step S215 is at a high level. When the determination result in step S216 indicates that the comparison result signal CMPOUT generated in step S215 is at a high level, that is, when the level of the third detection voltage V<2> is higher than that of the second detection voltage V<1>, the control unit 105 may set the second comparison control signal CMP2<3> to a high level, compare the levels of the third detection voltage V<2> and the fourth detection voltage V<3>, and generate the comparison result signal CMPOUT in step S217.

In Step S218, the control unit 105 may determine whether the comparison result signal CMPOUT generated in step S217 is at a high level. When the determination result in step S218 indicates that the comparison result signal CMPOUT generated in step S217 is at a high level, that is, when the level of the third detection voltage V<2> is higher than that of the fourth detection voltage V<3>, the control unit 105 may determine and save the third detection voltage V<2> as the maximum value in step S219 and step S209.

When the determination result in step S218 indicates that the comparison result signal CMPOUT generated in step S217 is at a low level, that is, when the level of the third detection voltage V<2> is lower than that of the fourth detection voltage V<3>, the control unit 105 may determine and save the fourth detection voltage V<3> as the maximum value in step S220 and step S209).

When the determination result in step S216 indicates that the comparison result signal CMPOUT generated in step S215 is at a low level, that is, when the level of the third detection voltage V<2> is lower than that of the second detection voltage V<1>, the control unit 105 may set the first comparison control signal CMP1<3> to a high level, compare the levels of the fourth detection voltage V<3> and the second detection voltage V<1>, and generate the comparison result signal CMPOUT in step S221.

In step S222, the control unit 105 may determine whether the comparison result signal CMPOUT generated in step S221 is at a high level. When the determination result in step S222 indicates that the comparison result signal CMPOUT generated in step S221 is at a high level, that is, when the level of the fourth detection voltage V<3> is higher than that of the second detection voltage V<1>, the control unit 105 may determine and save the fourth detection voltage V<3> as the maximum value in step S223 and step S209.

When the determination result in step S222 indicates that the comparison result signal CMPOUT generated in step S221 is at a low level, that is, when the level of the fourth detection voltage V<3> is lower than that of the second detection voltage V<1>, the control unit 105 may determine and save the second detection voltage V<1> as the maximum value in step S224 and step S209.

Examples of operations of the control unit 105 for detecting the minimum value among the plurality of detection voltages V<0:3> are described below with reference to FIG. 9B.

In the illustrated example, the control unit 105 may start a minimum value detection in step S225. In step S226, the control unit 205 may set the first comparison control signal CMP1<0> and the second comparison control signal CMP2<1> to a high level, compare the levels of the first detection voltage V<0> and the second detection voltage V<1>, and generate the comparison result signal CMPOUT.

In step S227, the control unit 105 may determine whether the comparison result signal CMPOUT generated in step S226 is at a high level. When the determination result in step S227 indicates that the comparison result signal CMPOUT generated in step S226 is at a low level, that is, when the level of the first detection voltage V<0> is lower than that of the second detection voltage V<1>, the control unit 105 may set the second comparison control signal CMP2<2> to a high level, compare the levels of the first detection voltage V<0> and the third detection voltage V<2>, and generate the comparison result signal CMPOUT in step S228.

In step S229, the control unit 105 may determine whether the comparison result signal CMPOUT generated in step S228 is at a high level. When the determination result in step S229 indicates that the comparison result signal CMPOUT generated in step S228 is at a low level, that is, when the level of the first detection voltage V<0> is lower than that of the third detection voltage V<2>, the control unit 105 may set the second comparison control signal CMP2<3> to a high level, compare the levels of the first detection voltage V<0> and the fourth detection voltage V<3>, and generate the comparison result signal CMPOUT in step S230.

In step S231, the control unit 105 may determine whether the comparison result signal CMPOUT generated in step S230 is at a high level. When the determination result in step S231 indicates that the comparison result signal CMPOUT generated in step S230 is at a low level, that is, when the level of the first detection voltage V<0> is lower than that of the fourth detection voltage V<3>, the control unit 105 may determine and save the first detection voltage V<0> as the minimum value in step S232 and step S233.

When the determination result in S231 indicates that the comparison result signal CMPOUT generated in step S230 is at a high level, that is, when the level of the first detection voltage V<0> is higher than that of the fourth detection voltage V<3>, the control unit 105 may determine and save the fourth detection voltage V<3> as the minimum value in step S234 and step S233.

When the determination result in step S229 indicates that the comparison result signal CMPOUT in step S228 is at a high level, that is, when the level of the first detection voltage V<0> is higher than that of the third detection voltage V<2>, the control unit 105 may set the first comparison control signal CMP1<3> to a high level, compare the levels of the fourth detection voltage V<3> and the third detection voltage V<2>, and generate the comparison result signal CMPOUT in step S235.

In step S236, the control unit 105 may determine whether the comparison result signal CMPOUT generated in step S235 is at a high level. When the determination result in step S236 indicates that the comparison result signal CMPOUT generated in step S235 is at a low level, that is, when the level of the fourth detection voltage V<3> is lower than that of the third detection voltage V<2>, the control unit 105 may determine and save the fourth detection voltage V<3> as the minimum value in step S237 and step S233.

When the determination result in step S236 indicates that the comparison result signal CMPOUT generated in step S235 is at a high level, that is, when the level of the fourth detection voltage V<3> is higher than that of the third detection voltage V<2>, the control unit 105 may determine and save the third detection voltage V<2> as the minimum value in step S238 and step S233.

When the determination result in step S227 indicates that the comparison result signal CMPOUT generated in step S226 is at a high level, that is, when the level of the first detection voltage V<0> is higher than that of the second detection voltage V<1>, the control unit 105 may set the first comparison control signal CMP1<2> to a high level, compare the levels of the third detection voltage V<2> and the second detection voltage V<1>, and generate the comparison result signal CMPOUT in step S239.

In step S240, the control unit 105 may determine whether the comparison result signal CMPOUT generated in step S239 is at a high level. When the determination result in step S240 indicates that the comparison result signal CMPOUT generated in step S239 is at a high level, that is, when the level of the third detection voltage V<2> is higher than that of the second detection voltage V<1>, the control unit 105 may set the first comparison control signal CMP1<3> to a high level, compare the levels of the fourth detection voltage V<3> and the second detection voltage V<1>, and generate the comparison result signal CMPOUT in step S241.

In step 242, the control unit 105 may determine whether the comparison result signal CMPOUT generated in step S241 is at a high level. When the determination result in step S242 indicates that the comparison result signal CMPOUT generated in step S241 is at a high level, that is, when the level of the fourth detection voltage V<3> is higher than that of the second detection voltage V<1>, the control unit 105 may determine and save the second detection voltage V<1> as the minimum value (in step S243 and step S233.

When the determination result in step S242 indicates that the comparison result signal CMPOUT generated in step S241 is at a low level, that is, when the level of the fourth detection voltage V<3> is lower than that of the second detection voltage V<1>, the control unit 105 may determine and save the fourth detection voltage V<3> as the minimum value in step S244 and step S233.

When the determination result in step S240 indicates that the comparison result signal CMPOUT generated in step S239 is at a low level, that is, when the level of the third detection voltage V<2> is lower than that of the second detection voltage V<1>, the control unit 105 may set the second comparison control signal CMP2<3> to a high level, compare the levels of the third detection voltage V<2> and the fourth detection voltage V<3>, and generate the comparison result signal CMPOUT in step S245.

In step S246, the control unit 105 may determine whether the comparison result signal CMPOUT generated in step S245 is at a high level When the determination result in step S246 indicates that the comparison result signal CMPOUT generated in step S245 is at a high level, that is, when the level of the third detection voltage V<2> is higher than that of the fourth detection voltage V<3>, the control unit 105 may determine and save the fourth detection voltage V<3> as the minimum value in step S247 and step S233.

When the determination result in step S246 indicates that the comparison result signal CMPOUT generated in step S245 is at a low level, that is, when the level of the third detection voltage V<2> is lower than that of the fourth detection voltage V<3>, the control unit 105 may determine and save the third detection voltage V<2> as the minimum value in step S248 and step S233.

Figure 10:
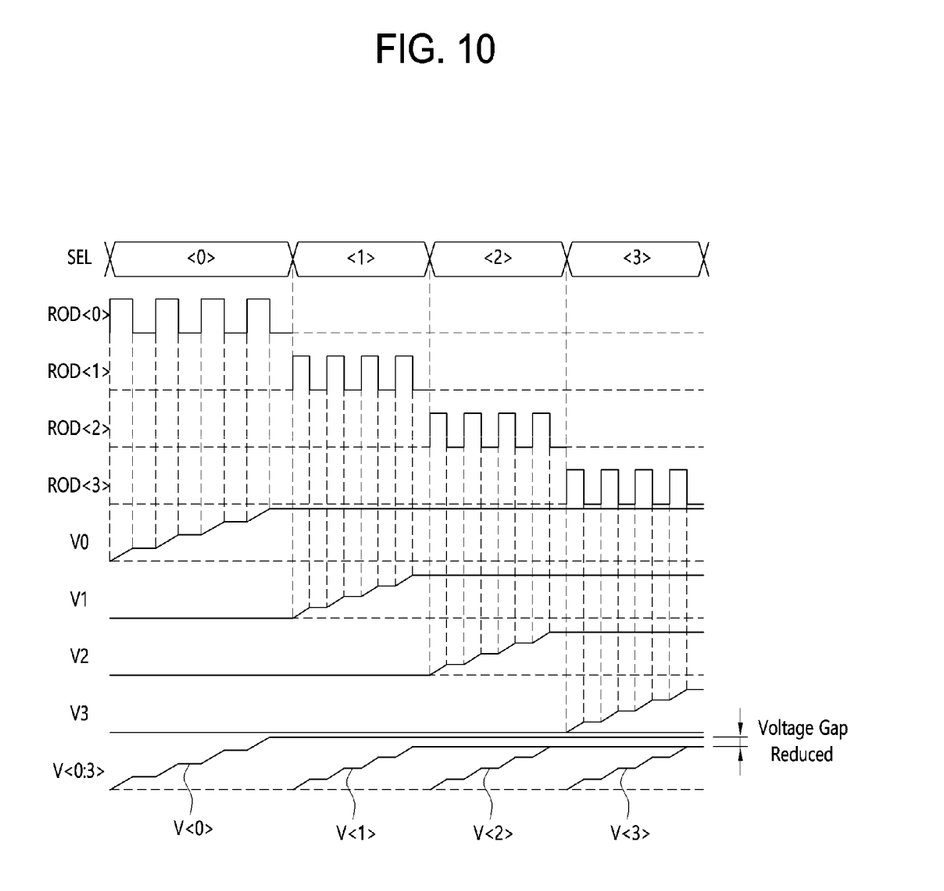
FIG. 10 illustrates examples of signal waveforms in a sampling step after a delay time adjustment step of the phase correction method of FIG. 6.

FIG. 10 illustrates examples of signal waveforms in the sampling step S400 after the delay time adjustment step S300 of the phase correction method of FIG. 6.

In the illustrated example, the fourth detection voltage V<3> may be determined to be the minimum value in the maximum value/minimum value detection step S200 of FIG. 6 described above, and the delay time in the fourth signal path 34 may increase as the delay time adjustment step S300 is performed. For example, the control unit 105 may generate the fourth phase control signal CPC<D> and apply the fourth phase control signal CPC<D> to the delay adjustment circuit (e.g., a tunable capacitor such as capacitor 230) to increase the capacitance of the delay adjustment circuit, thereby increasing the time delay of the fourth signal path 34.

By performing the sampling step S400 in the state in which the delay time in the fourth signal path 34 has increased, an increase in the level of the fourth detection voltage V<3> may be detected. In this way, as the steps S300, S400, S500, and S600 of FIG. 6 described above are repeated, the differences in the delay times among the plurality of signal paths 31 to 34 are reduced to within a preset error range, and the voltage gap between the minimum value and the maximum value of the detection voltages may be reduced to within a certain range, so that the phase correction operation may be ended.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims described below rather than the detailed description, and it should be construed that the meaning and scope of the claims and all changes or modified forms derived from the equivalent concept thereof are included in the scope of the present disclosure.

What is claimed is:

1. A phase correction circuit comprising:
a test clock generation unit including a plurality of signal paths and configurable to generate a plurality of test clock signals in response to a plurality of selection signals and a plurality of phase control signals, wherein the test clock generation unit is configurable to block input of external signals to the plurality of signal paths in response to the plurality of selection signals;
a detection unit configured to generate a plurality of detection voltages using the plurality of test clock signals; and
a control unit configured to:
generate the plurality of selection signals;
detect phase skews of the plurality of signal paths according to the plurality of detection voltages; and
generate the plurality of phase control signals for correcting the phase skews of the plurality of signal paths.

2. The phase correction circuit according to claim 1, wherein the test clock generation unit is configurable to:
stop generating the plurality of test clock signals in response to the plurality of selection signals; and
allow external signals to pass through the plurality of signal paths.

3. The phase correction circuit according to claim 1, wherein the test clock generation unit includes a plurality of test clock generation units, each of the plurality of test clock generation units comprising:
a multiplexer configurable to output an external signal or a first test clock signal among the plurality of test clock signals, in response to a first selection signal among the plurality of selection signals;
an oscillation circuit configured to generate the first test clock signal; and
a delay adjustment circuit configured to adjust a delay time in a first signal path among the plurality of signal paths in response to a first phase control signal among the plurality of phase control signals.

4. The phase correction circuit according to claim 3, wherein the oscillation circuit comprises:
the first signal path; and
a logic gate configured to combine the first selection signal and output of the first signal path and to provide a combined signal to the multiplexer.

5. The phase correction circuit according to claim 1, wherein the detection unit comprises:
a multiplexer configured to select and output one test clock signal of the plurality of test clock signals according to the plurality of selection signals;
a first switching section having one end connected to a current source and configured to operate according to an output of the multiplexer;
a second switching section having one end connected to the other end of the first switching section and configured to operate according to the plurality of selection signals; and
a capacitor array connected to the second switching section and configured to output stored voltages as the plurality of detection voltages.

6. The phase correction circuit according to claim 1, wherein the control unit comprises:
a first multiplexer configured to select and output one detection voltage of the plurality of detection voltages according to a plurality of first comparison control signals;

a second multiplexer configured to select and output another detection voltage of the plurality of detection voltages according to a plurality of second comparison control signals;

a comparator configured to generate a comparison result signal by comparing an output of the first multiplexer and an output of the second multiplexer; and a state machine configured to generate the plurality of selection signals, the plurality of first comparison control signals, the plurality of second comparison control signals, and the plurality of phase control signals for a phase correction operation of the phase correction circuit.

7. The phase correction circuit according to claim 6, wherein the state machine is configured to:

detect a maximum value and a minimum value among the plurality of detection voltages according to the comparison result signal;

generate the plurality of phase control signals based on the minimum value; and determine whether to end the phase correction operation of the phase correction circuit based on whether the maximum value of the plurality of detection voltages is changed.

8. A clock buffer comprising:

a phase separator configured to receive external clock signals to generate multi-phase clock signals;

a plurality of signal paths configured to delay the multi-phase clock signals and output the delayed multi-phase clock signals as phase correction clock signals; and a phase correction circuit configurable to:
block input of the multi-phase clock signals to the plurality of signal paths; and
generate a plurality of test clock signals, and to detect and correct skews of the plurality of signal paths by allowing the plurality of test clock signals to pass through the plurality of signal paths.

9. The clock buffer according to claim 8, wherein the phase correction circuit is configurable to:

block the input of the multi-phase clock signals to the plurality of signal paths in a test mode; and stop generating the plurality of test clock signals and allow the multi-phase clock signals to pass through the plurality of signal paths in a normal mode.

10. The clock buffer according to claim 8, wherein the phase correction circuit comprises:

a test clock generation unit configurable to generate the plurality of test clock signals in response to a plurality of selection signals and a plurality of phase control signals;

a detection unit configured to generate a plurality of detection voltages using the plurality of test clock signals; and a control unit configured to:
generate the plurality of selection signals;
detect the skews of the plurality of signal paths based on the plurality of detection voltages; and
generate the plurality of phase control signals for correcting the skews of the plurality of signal paths.

11. The clock buffer according to claim 10, wherein the test clock generation unit includes a plurality of test clock generation units, each of the plurality of test clock generation units comprising:

a multiplexer configurable to output a first phase clock signal among the multi-phase clock signals or a first test clock signal among the plurality of test clock signals, in response to a first selection signal among the plurality of selection signals;

an oscillation circuit configured to generate the first test clock signal; and a delay adjustment circuit configured to adjust a delay time in a first signal path among the plurality of signal paths in response to a first phase control signal among the plurality of phase control signals.

12. The clock buffer according to claim 10, wherein the detection unit comprises:

a multiplexer configured to select and output one test clock signal of the plurality of test clock signals according to the plurality of selection signals;

a first switching section having one end connected to a current source and configured to operate according to an output of the multiplexer;

a second switching section having one end connected to the other end of the first switching section and configured to operate according to the plurality of selection signals; and a capacitor array connected to the second switching section and configured to generate the plurality of detection voltages.

13. The clock buffer according to claim 10, wherein the control unit is configured to:

determine a maximum value and a minimum value of the plurality of detection voltages;

generate the plurality of phase control signals based on the minimum value; and determine whether to end a phase correction operation of the phase correction circuit based on whether the maximum value is changed.

14. A semiconductor apparatus comprising:

a memory area;

a data output circuit configured to receive data from the memory area and output the data according to phase correction clock signals;

a plurality of signal paths configured to delay multi-phase clock signals and output the delayed multi-phase clock signals as the phase correction clock signals; and a clock buffer configurable to:
receive external clock signals to generate the multi-phase clock signals;
block input of the multi-phase clock signals to the plurality of signal paths;
generate a plurality of test clock signals; and
detect skews of the plurality of signal paths by allowing the plurality of test clock signals to pass through the plurality of signal paths.

15. The semiconductor apparatus according to claim 14, wherein the clock buffer is configurable to:

block the input of the multi-phase clock signals to the plurality of signal paths in a test mode; and stop generating the plurality of test clock signals and allow the multi-phase clock signals to pass through the plurality of signal paths in a normal mode.

16. The semiconductor apparatus according to claim 14, wherein the clock buffer is configured to:

detect a maximum value and a minimum value of a plurality of detection voltages generated by allowing the plurality of test clock signals to pass through the plurality of signal paths;

correct skews of the plurality of signal paths based on the minimum value; and determine whether to end a phase correction operation based on whether the maximum value is changed.

17. The semiconductor apparatus according to claim 14, wherein the clock buffer comprises:
- a phase separator configured to receive the external clock signals to generate the multi-phase clock signals;
- a test clock generation unit configured to generate the plurality of test clock signals in response to a plurality of selection signals and a plurality of phase control signals;
- a detection unit configured to generate a plurality of detection voltages using the plurality of test clock signals; and
- a control unit configured to:
  - generate the plurality of selection signals;
  - detect the skews of the plurality of signal paths according to the plurality of detection voltages; and
  - generate a plurality of phase control signals for correcting the skews of the plurality of signal paths.

18. The semiconductor apparatus according to claim 17, wherein the test clock generation unit includes a plurality of test clock generation units, each of the plurality of test clock generation units comprising:
- a multiplexer configurable to output a first phase clock signal among the multi-phase clock signals or a first test clock signal among the plurality of test clock signals, in response to a first selection signal among the plurality of selection signals;
- an oscillation circuit configured to generate the first test clock signal in response to the first selection signal; and
- a delay adjustment circuit configured to adjust a delay time in a first signal path among the plurality of signal paths in response to a first phase control signal among the plurality of phase control signals.

19. The semiconductor apparatus according to claim 17, wherein the detection unit comprises:
- a multiplexer configured to select and output one test clock signal of the plurality of test clock signals according to the plurality of selection signals;
- a first switching section having one end connected to a current source and configured to operate according to an output of the multiplexer;
- a second switching section having one end connected to the other end of the first switching section and configured to operate according to the plurality of selection signals; and
- a capacitor array connected to the second switching section and configured to output stored voltages as the plurality of detection voltages.

* * * * *